United States Patent
Price et al.

(10) Patent No.: US 11,626,568 B1
(45) Date of Patent: Apr. 11, 2023

(54) ORGANIC LIGHT-EMITTING DIODE DISPLAY WITH A CONDUCTIVE LAYER HAVING AN ADDITIVE

(71) Applicant: Apple Inc., Cupertino, CA (US)

(72) Inventors: Jared S. Price, San Jose, CA (US); Mathew K. Mathai, San Jose, CA (US); Hitoshi Yamamoto, Palo Alto, CA (US); Martijn Kuik, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 140 days.

(21) Appl. No.: 17/161,492

(22) Filed: Jan. 28, 2021

Related U.S. Application Data

(60) Provisional application No. 62/994,095, filed on Mar. 24, 2020.

(51) Int. Cl.
    *H01L 51/52* (2006.01)
    *H01L 51/50* (2006.01)
    *H01L 51/56* (2006.01)
    *H01L 27/32* (2006.01)

(52) U.S. Cl.
    CPC ...... *H01L 51/5209* (2013.01); *H01L 27/3246* (2013.01); *H01L 51/5088* (2013.01); *H01L 51/5092* (2013.01); *H01L 51/5225* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 6,486,601 B1 | 11/2002 | Sakai et al. | |
| 8,431,448 B2 * | 4/2013 | Obata | H01L 51/002 |
| | | | 438/149 |
| 8,628,986 B2 | 1/2014 | Amamiya et al. | |
| 9,091,415 B2 | 7/2015 | Bessho et al. | |
| 9,356,251 B2 | 5/2016 | Goda | |
| 9,735,212 B2 * | 8/2017 | Pang | H01L 27/3248 |
| 9,978,818 B2 | 5/2018 | Xiong et al. | |
| 2004/0119419 A1 | 6/2004 | Kai et al. | |

(Continued)

FOREIGN PATENT DOCUMENTS

KR    20160072010 A    6/2016

*Primary Examiner* — Michelle Mandala
(74) *Attorney, Agent, or Firm* — Treyz Law Group, P.C.; Joseph F. Guihan

(57) ABSTRACT

An organic light-emitting diode (OLED) display may have an array of organic light-emitting diode pixels that each have OLED layers interposed between a cathode and an anode. Voltage may be applied to the anode of each pixel to control the magnitude of emitted light. The conductivity of the OLED layers may allow leakage current to pass between neighboring anodes in the display. To reduce leakage current and the accompanying cross-talk, resistance of a laterally conductive OLED layer may be increased. The laterally conductive layer may include an organic host material, dopants, and a resistance-increasing additive. Another way to reduce leakage current is to apply bias voltages to the anodes of the display and/or expose the laterally conductive layer to ultraviolet light, causing dopants within the laterally conductive layer to degrade.

18 Claims, 10 Drawing Sheets

(56) References Cited

U.S. PATENT DOCUMENTS

| | | |
|---|---|---|
| 2010/0033089 A1 | 2/2010 | Nakamura et al. |
| 2010/0090202 A1* | 4/2010 | Obata ................ H01L 51/0023 |
| | | 438/45 |
| 2012/0007067 A1 | 1/2012 | Kaneta et al. |
| 2013/0154478 A1* | 6/2013 | Ohe ...................... H01L 27/322 |
| | | 257/40 |
| 2014/0077189 A1 | 3/2014 | Kugler et al. |
| 2015/0048328 A1 | 2/2015 | Kato et al. |
| 2015/0323711 A1* | 11/2015 | Bessho ............. G02F 1/133606 |
| | | 349/71 |
| 2016/0248035 A1 | 8/2016 | Hwang et al. |
| 2019/0165295 A1* | 5/2019 | Toyoda ................... H01L 51/56 |
| 2020/0066815 A1 | 2/2020 | Choi et al. |

* cited by examiner

ORGANIC LIGHT-EMITTING DIODE DISPLAY WITH A CONDUCTIVE LAYER HAVING AN ADDITIVE

This application claims the benefit of provisional patent application No. 62/994,095, filed Mar. 24, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

To emit light from a given pixel in an organic light-emitting diode display, a voltage may be applied to the anode of the given pixel. Ideally, the voltage at the anode of the given pixel would not affect any neighboring pixels. However, the conductivity of the OLED layers between the anodes may allow lateral conduction from the anode of the given pixel to the anodes of adjacent pixels. This may cause pixel cross-talk that allows nominally 'off' pixels to emit light due to an adjacent 'on' pixel's leakage. The pixel cross-talk may degrade display performance and cause a color-shift in the resulting image.

It may be desirable to reduce the distance between pixels in a display in order to increase the resolution of the display. However, pixel cross-talk due to lateral conduction through OLED layers may worsen as the distance between pixels decreases.

It would therefore be desirable to be able to provide improved displays for electronic devices.

SUMMARY

An electronic device may have a display such as an organic light-emitting diode display. The organic light-emitting diode (OLED) display may have an array of organic light-emitting diode pixels that each have OLED layers interposed between a cathode and an anode.

Each organic light-emitting diode pixel may have a respective anode. Voltage may be applied to the anode of each organic light-emitting diode pixel to control how much light is emitted from each organic light-emitting diode pixel. OLED layers formed above the anode (e.g., a hole injection layer, a hole transport layer, an emissive layer, an electron transport layer, an electronic injection layer, an electron blocking layer, a charge generation layer, and/or a hole blocking layer) may be conductive. These conductive layers may be referred to as laterally conductive layers. The conductivity of the OLED layers may allow leakage current to pass between neighboring anodes in the display.

To reduce leakage current and the accompanying cross-talk in a display, resistance of the laterally conductive layer may be increased. In one example, a resistance-increasing additive may be added to the laterally conductive layer. The laterally conductive layer may include an organic host material, dopants, and the resistance-increasing additive. The diode performance of the laterally conductive layer may remain satisfactory while reducing lateral leakage between pixels due to the increased resistance.

Another way to reduce leakage current is to apply bias voltages to the anodes of the display, causing dopants within the laterally conductive layer to degrade. This causes the dopants to become inert, increasing the resistivity of the laterally conductive layer in areas between the pixels. Alternatively, or in addition, the laterally conductive layer may be selectively exposed to ultraviolet light. The ultraviolet light exposure may cause dopants within the laterally conductive layer to degrade, increasing the resistivity of the laterally conductive layer in areas between the pixels.

Alternatively, the pixel definition layer of a display may initially be formed with an additive. Energy (such as heat or ultraviolet light) may be applied to the pixel definition layer to cause the additive to migrate into the laterally conductive layer. The additive may undergo an irreversible chemical reaction with the host or dopants in the laterally conductive layer to increase resistance in the laterally conductive layer.

DETAILED DESCRIPTION

Figure 1:
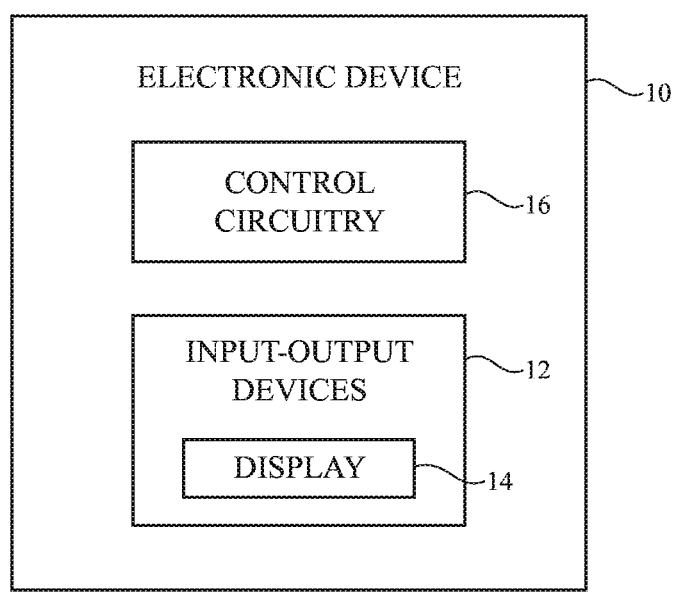
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user. As examples, electronic device 10 may be an augmented reality (AR) headset and/or virtual reality (VR) headset.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
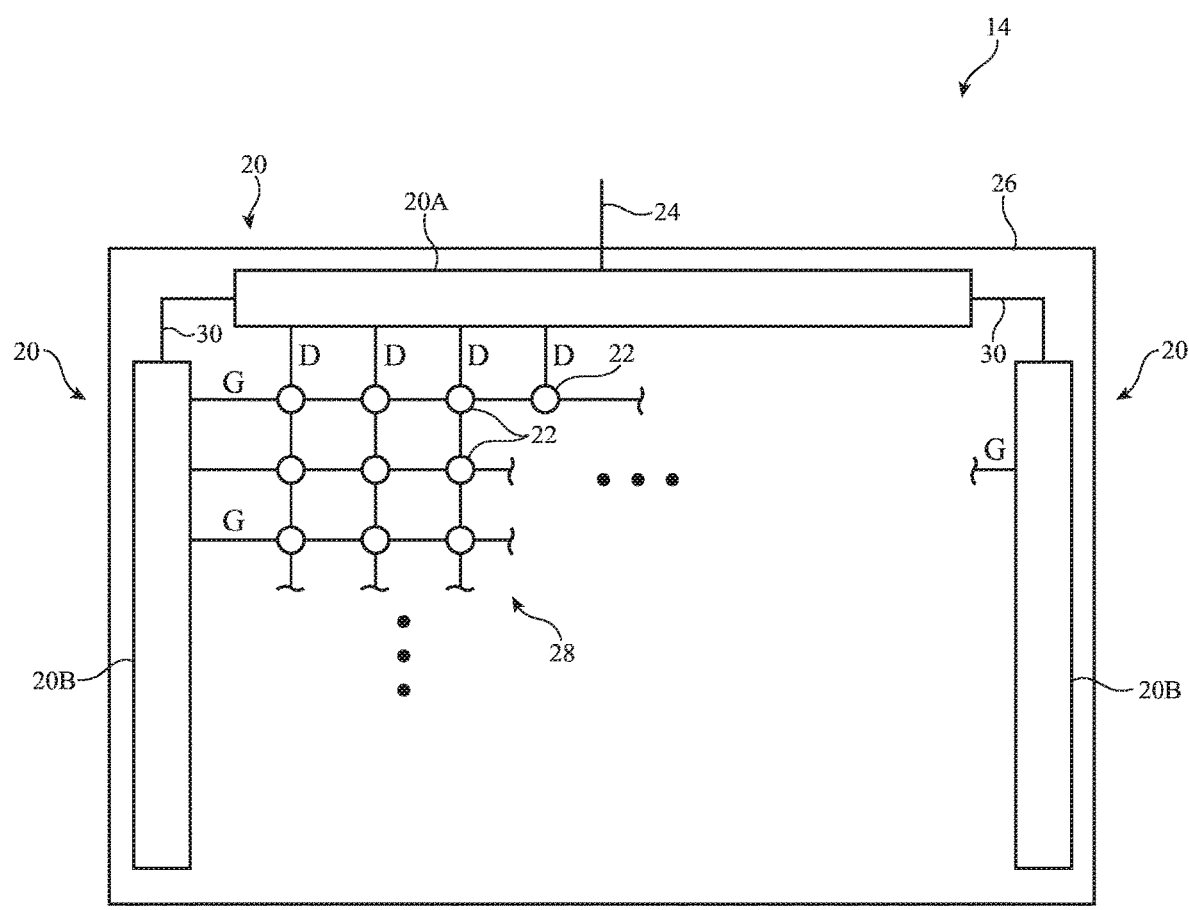
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
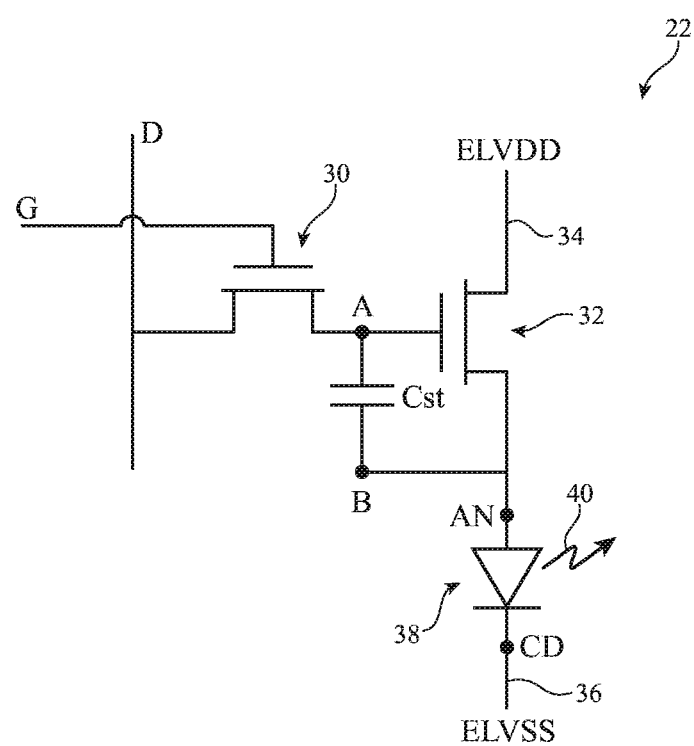
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
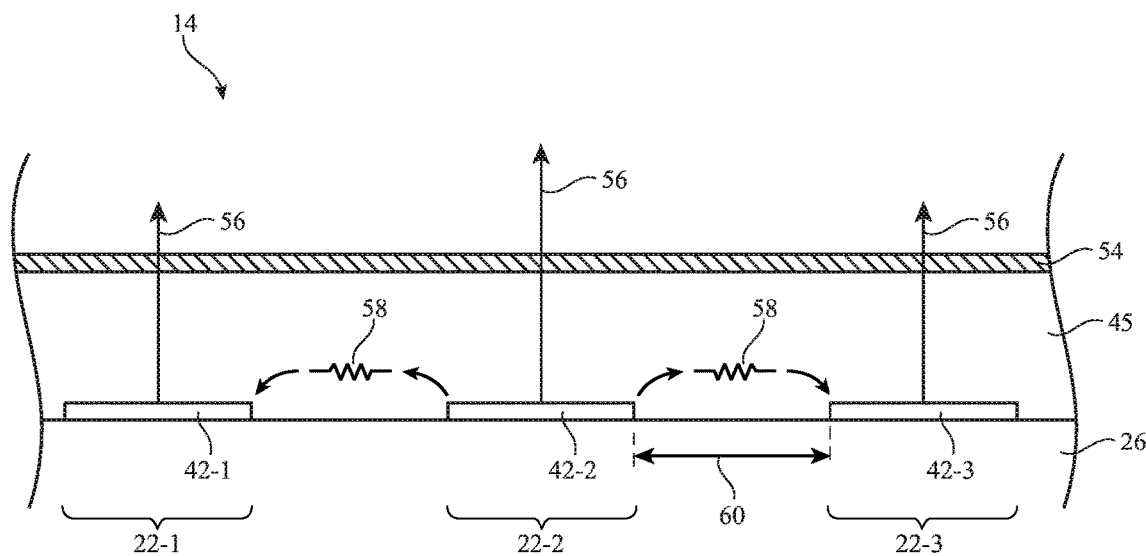
FIG. 4 is a cross-sectional side view of an illustrative organic light-emitting diode display showing lateral current leakage between adjacent anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Anodes such as anodes 42-1, 42-2, and 42-3 may be formed on the substrate. Anodes 42-1, 42-2, and 42-3 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an emissive layer (EML), an electron-transport layer (ETL), and an electronic-injection layer (EIL). Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

Anodes 42-1, 42-2, and 42-3 may each be associated with a respective pixel. For example, anode 42-1 may be associated with pixel 22-1, anode 42-2 may be associated with pixel 22-2, and anode 42-3 may be associated with pixel 22-3. To emit light from a pixel, a voltage may be applied to the anode of the respective pixel. Take an example in which it is desired to emit light from pixel 22-2 (without emitting light from pixels 22-1 and 22-3). A voltage may be applied to anode 42-2, which causes light 56 to be emitted from pixel 22-2. As previously stated, it would be desirable if no light was emitted from pixels 22-1 and 22-3 as a result of voltage being applied to anode 42-2. However, as shown, leakage may occur through OLED layers 45 between anode 42-2 and anode 42-1, as well as between anode 42-2 and anode 42-3. There may be a resistance 58 (i.e., a resistance associated with the OLED layers) between anode 42-2 and the adjacent anodes that helps prevent leakage. The greater the resistance, the less leakage current will reach anodes 42-1 and 42-3. However, the resistance may not be large enough to totally eliminate leakage between anode 42-2 and anodes 42-1 and 42-3. As shown, even though pixels 22-1 and 22-3 are intended to be off, light 56 may be emitted from pixels 22-1 and 22-3. The resistance 58 between adjacent anodes may be reduced as the distance 60 between adjacent anodes is reduced. In order to maximize display resolution, it is desirable for the distance 60 between adjacent anodes to be small. However, this reduces the resistance 58 between anodes and increases cross-talk between pixels.

Although not shown in FIG. 4, display 14 may optionally include a pixel definition layer (PDL). The pixel definition layer may be formed from a dielectric material and may be interposed between adjacent anodes of the display. The pixel definition layer may have openings in which the anodes are formed, thereby defining the area of each pixel. Each of the following embodiments of an organic light-emitting diode display may optionally include a pixel definition layer.

Figure 5A:
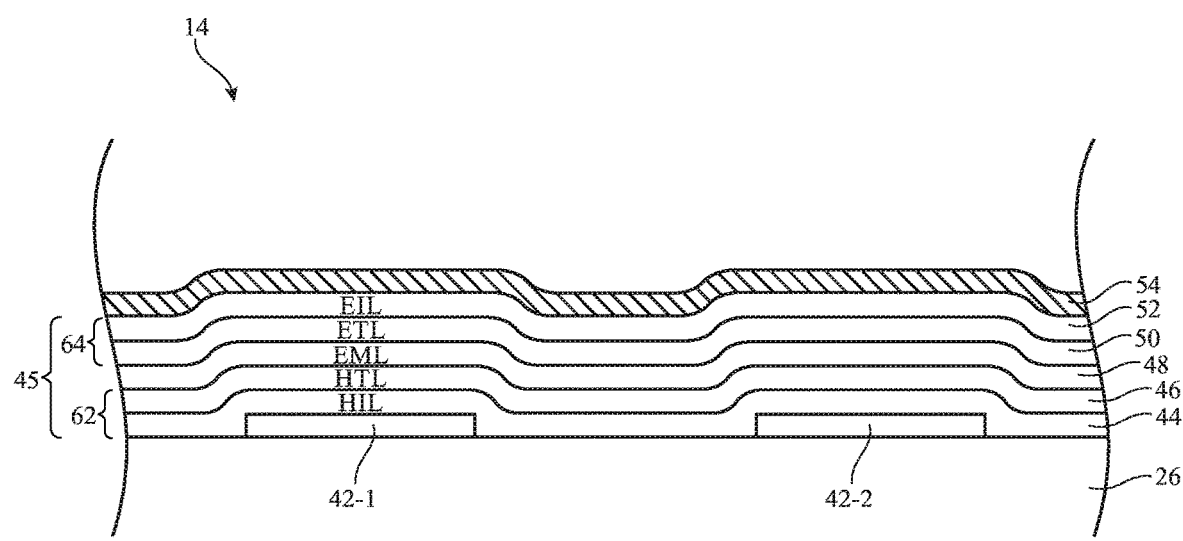
FIG. 5A is a cross-sectional side view of an illustrative organic light-emitting diode display showing different layers of the organic light-emitting diodes in accordance with an embodiment.

FIG. 5A is a cross-sectional side view of an illustrative display with organic light-emitting diode display pixels. FIG. 5A shows details of the OLED layers 45 from FIG. 4. As shown, OLED layers 45 (sometimes referred to as an organic stack-up, an organic stack, or an organic light-emitting diode (OLED) stack) may include a hole injection layer (HIL) 44, a hole transport layer (HTL) 46, an emissive layer (EML) 48, an electron transport layer (ETL) 50, and an electronic injection layer (EIL) 52 interposed between anodes 42 and cathode 54. The hole injection layer and hole transport layer may collectively be referred to as a hole layer (i.e., hole layer 62). The electron transport layer and the electron injection layer may collectively be referred to as an electron layer (i.e., electron layer 64). Emissive layer 48 may include organic electroluminescent material. As shown, hole layer 62 and electron layer 64 may be blanket (common) layers that cover the entire array.

Ideally, adjacent diodes in display 14 operate independently. In practice, the presence of common layers such as hole layer 62 present an opportunity for leakage current from one diode to flow laterally into an adjacent diode, thereby potentially biasing the adjacent diode. For example, there is a possibility that the process of applying a drive current between anode 42-1 and cathode 54 will give rise to lateral leakage current through hole layer 62 (e.g., a current from anode 42-1 to anode 42-2). In order to reduce leakage between anodes through hole layer 62, it may be desirable to increase the resistance of the hole layer between adjacent anodes.

The examples of layers included between the anodes 42 and the cathode 54 in FIG. 5A are merely illustrative. If desired, additional layers may be included between anodes 42 and cathode 54 (i.e., an electron blocking layer, a charge generation layer, a hole blocking layer, etc.), such as in a tandem organic light-emitting diode.

Figure 5B:
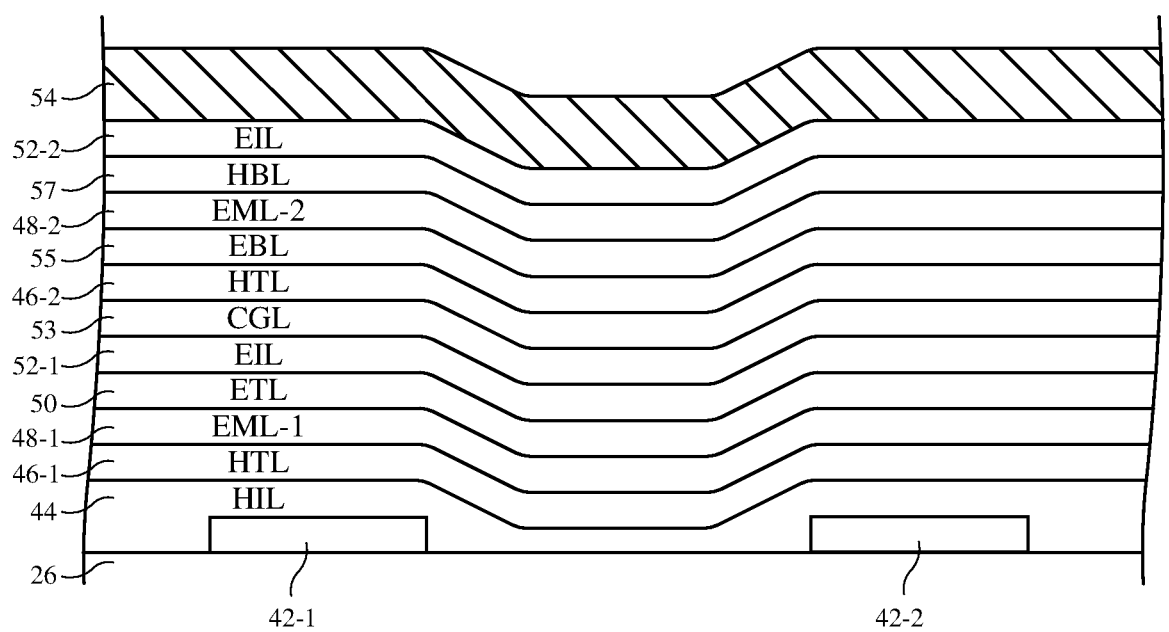
FIG. 5B is a cross-sectional side view of an illustrative organic light-emitting diode display showing different layers of a tandem organic light-emitting diode in accordance with an embodiment.

FIG. 5B is a cross-sectional side view of a tandem organic light-emitting diode (OLED), with at least two stacked OLED units. As shown in FIG. 5B, the tandem OLED may include a hole injection layer (HIL) 44, a first hole transport layer (HTL) 46-1, a first emissive layer (EML-1) 48, an electron transport layer (ETL) 50, a first electronic injection layer (EIL) 52-1, a charge generation layer (CGL) 53, a second hole transport layer (HTL) 46-2, an electron blocking layer (EBL) 55, a second emissive layer (EML-2) 48-2, a hole blocking layer (HBL) 57, and a second electron injection layer (EIL) 52-2 interposed between anodes 42 and cathode 54.

In general, any desired layers may be included in between the anodes and the cathode and any layer that is formed across the display may be considered a common laterally conductive layer. Each layer in light-emitting diode (LED) layers 45 may be formed from any desired material. In some embodiments, the layers may be formed from organic material (optionally including organic or inorganic dopants). However, in some cases one or more layers may be formed from inorganic material. Any or all of the LED layers 45 may be blanket (common) layers that cover the entire array. The display may also include quantum dots (e.g., quantum dot layers) if desired. For example, a display may include OLEDs to produce blue light and quantum dot layers to convert the blue light to red and green light.

In the example of FIGS. 5A and 5B, a patterned anode layer is formed below a common cathode layer. This example is merely illustrative. If desired, the organic light-emitting diode may be inverted such that the cathode is patterned per-pixel and the anode is a common layer. In this case, the order of the OLED layers in organic stack 45 may be inverted as well. For example, the electron injection layer may be formed on a patterned cathode, the electron transport layer may be formed on the electron injection layer, the emissive layer may be formed on the electron transport layer, the hole transport layer may be formed on the emissive layer, the hole injection layer may be formed on the hole transport layer, and a common anode layer may be formed on the hole injection layer.

In subsequent embodiments, a patterned anode is depicted as being positioned below a common cathode layer. However, it should be understood that in each of these embodiments the anode and cathode may be inverted as previously described.

In some cases, a laterally conductive layer may be patterned or otherwise formed with gaps to reduce lateral leakage between pixels. In other words, the laterally conductive layer may be physically interrupted by an air gap or other barrier that prevents lateral leakage from occurring. Another option for reducing lateral leakage is to use a material-based approach. In this type of approach, materials may be added to the laterally conductive layer to increase the resistance of the laterally conductive layer. The laterally conductive layer may also be selectively modified in areas between the pixels to have a selectively increased resistance that decreases lateral leakage.

Figure 6A:
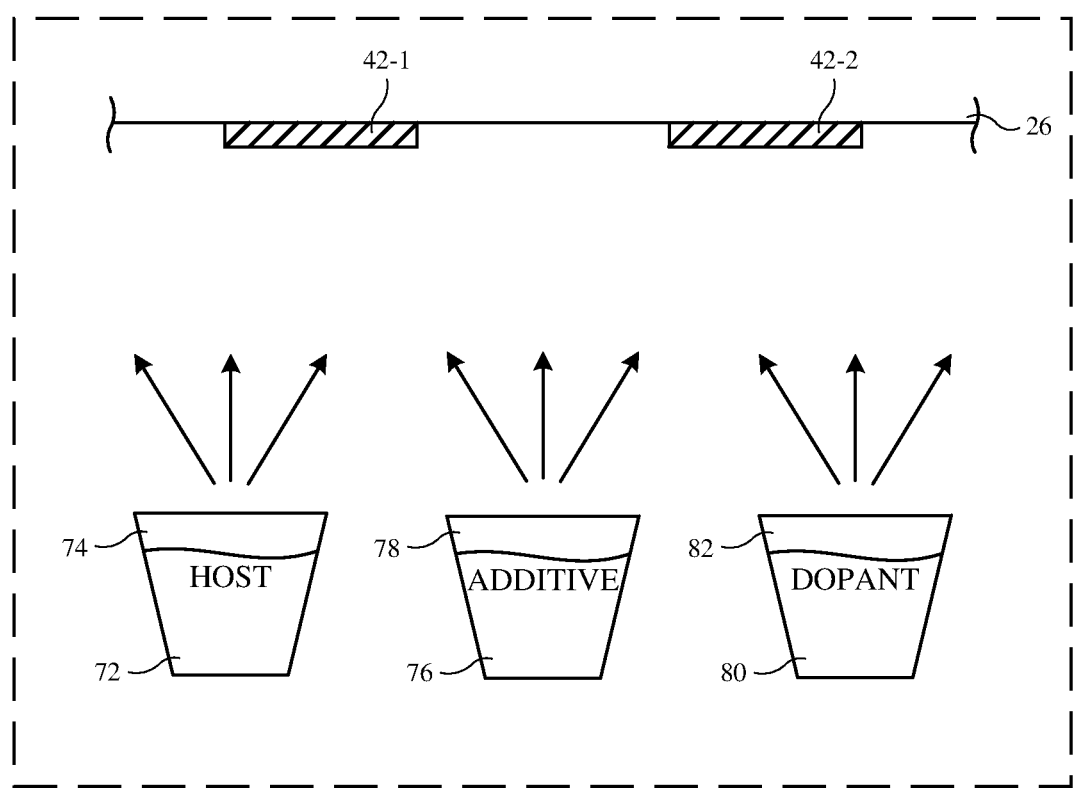
FIG. 6A is a cross-sectional side view of an illustrative system for forming a laterally conductive layer with an additive to increase resistance in accordance with an embodiment.

FIG. 6A is a cross-sectional side view of a system for forming a laterally conductive layer with increased resistance. In the example of FIG. 6A, the laterally conductive layer is deposited using evaporative deposition. In this type of system, substrate 26 with anodes (such as anodes 42-1 and 42-2) may be placed in a chamber 68. Chamber 68 may be held at a vacuum during the deposition process. Materials for the laterally conductive layer are also included in the chamber.

As shown in FIG. 6A, host material 72 may be formed in a first source 74, additive 76 may be formed in a second source 76, and dopant 80 may be formed in a third source 82. During deposition, the materials in each source may be heated to cause evaporation of each material, which causes the materials to condense on substrate 26 and anodes 42.

Figure 6B:
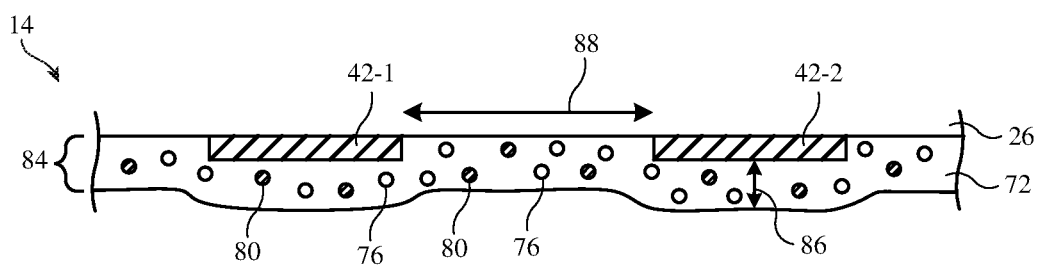
FIG. 6B is a cross-sectional side view of an illustrative display with a laterally conductive layer that includes a resistance-increasing additive in accordance with an embodiment.

FIG. 6B is a cross-sectional side view of an illustrative display showing the laterally conductive layer 84 formed by the evaporative deposition process of FIG. 6A. The laterally conductive layer 84 includes host material 72. Host material 72 may be an organic material. Dopant 80 may be interspersed within host material 72. Dopant 80 may be an organic or inorganic dopant that reduces the injection barrier (e.g., hole injection barrier) at the interface between the anodes and the laterally conductive layer (e.g., hole injection layer). When the laterally conductive layer is a hole based layer (HIL or HTL), dopant 80 may be a p-type dopant. When the laterally conductive layer is an electron based layer (EIL or ETL), dopant 80 may be an n-type dopant. When the laterally conductive layer 84 includes only host material 72 and dopant 80, the laterally conductive layer 84 may suffer from lateral leakage between adjacent anodes. However, additive 76 may increase the resistivity of the laterally conductive layer to reduce leakage between the pixels.

Transport in the host material (e.g., a disordered, thermally evaporated organic material) is percolative/hopping-based. Specifically, conductive filaments may be formed in the host material and the majority of conduction may occur on the molecules in these conductive filaments. The additive material may be selected to mitigate this type of transport through the host material of the laterally conductive layer. If the laterally conductive layer 84 is a hole based layer (e.g., a hole injection layer or hole transport layer), the additive material 76 (sometimes referred to as insulating material 76, non-conductive material 76, resistance-increasing material 76, etc.) may have a deeper highest occupied molecular orbital (HOMO) than the host material 72. If the laterally conductive layer 84 is an electron layer (e.g., an electron injection layer or electron transport layer), the additive material 76 may have a shallower lowest unoccupied molecular orbital (LUMO) than the host material 72. The energy gap between the HOMOs (or LUMOs) of the additive and host/dopant may be sufficiently large to prevent transport on (or doping from) the additive. This effectively leads to a tortuous conduction path through the host material. Increasing the length of the transport path in this manner increases the resistivity of the laterally conductive layer.

The additive may increase the resistivity of the laterally conductive layer without adverse effect on the diode performance of the laterally conductive layer. The thickness 86 of the laterally conductive layer may be less than the distance 88 between adjacent anodes within the display. The thickness 86 is the dimension of interest for the diode performance of the laterally conductive layer 84, whereas distance 88 affects the lateral leakage between pixels.

It should be noted that FIG. 6B is not drawn to scale. In practice, thickness 86 may be very small (e.g., less than 100 nanometers, less than 1,000 nanometers, between 10 nanometers and 100 nanometers, less than 200 nanometers, less than 10 nanometers, greater than 5 nanometers, greater than 10 nanometers, between 5 nanometers and 200 nanometers, between 5 nanometers and 20 nanometers, etc.). Distance 88, meanwhile, may be greater than 500 nanometers, greater than 1,000 nanometers, greater than 2,000 nanometers, greater than 5,000 nanometers, less than 2,000 nanometers, less than 1,500 nanometers, between 1,000 nanometers and 2,000 nanometers, between 1,000 nanometers and 1,500 nanometers, etc. The ratio between the magnitudes of distance 88 and 86 may be fairly large (e.g., over 10:1, over 50:1, over 100:1, over 500:1, over 1,000:1, over 2,000:1, less than 2,000:1, less than 1,000:1, between 50:1 and 1,500:1, between 100:1 and 1,000:1, between 10:1 and 1,000:1, etc.). Therefore, over the short distance of the thickness of the laterally conductive layer, the modified material properties caused by the additive 76 may not have a significant impact to the diode performance. However, over the longer distance 88 between adjacent anodes, the increased resistance may significantly reduce lateral leakage. For example, the presence of the additive may reduce lateral current flow (compared to the same laterally conductive layer without the additive) by a factor of more than 5, more than 10, more than 25, more than 50, etc. The presence of the additive may increase resistance of the laterally conductive layer (compared to the same laterally conductive layer without the additive) by 5% or more, 10% or more, 20% or more, 50% or more, etc.

The additive 76 may make up a volume percentage of the overall laterally conductive layer 84 of greater than 5%, greater than 10%, greater than 20%, greater than 30%, greater than 40%, greater than 50%, greater than 75%, less than 90%, less than 75%, less than 50%, less than 40%, less than 30%, between 10% and 90%, between 10% and 50%, between 20% and 60%, between 40% and 60%, etc.

Figure 7:
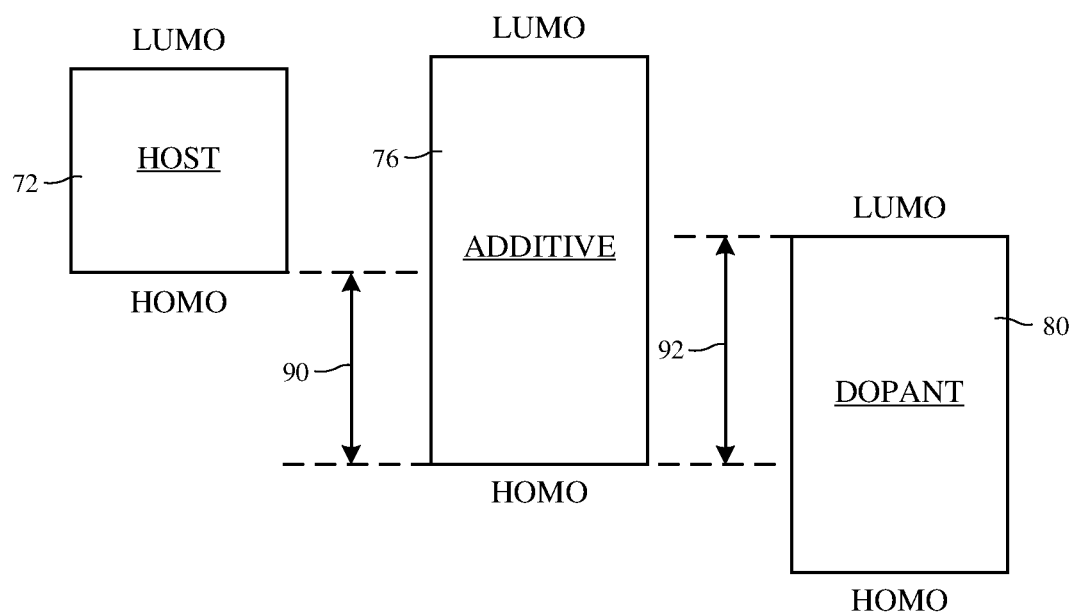
FIG. 7 is a diagram showing the highest occupied molecular orbital (HOMO) and lowest unoccupied molecular orbital (LUMO) levels of the materials in the laterally conductive layer of FIG. 6B in accordance with an embodiment.

FIG. 7 is a diagram showing how the additive may be selected to have a sufficient energy gap relative to the host material and dopant material. As shown in FIG. 7, each material (e.g., host 72, additive 76, and dopant 80) has a corresponding lowest unoccupied molecular orbital (LUMO) and highest occupied molecular orbital (HOMO). The LUMO and HOMO values may be measured in units of energy (e.g., an electron volt eV). The design constraints of the selected additive may depend on the type of laterally conductive layer being formed. First, consider the example where the laterally conductive layer is a hole based layer (e.g., a hole transport layer or hole injection layer).

In forming a hole based layer, the HOMO of the additive 76 may be deeper than the HOMO of the host material 72. This is reflected in FIG. 7 by energy gap 90. The energy gap may be greater than 0.2 eV, greater than 0.3 eV, greater than 0.4 eV, greater than 0.5 eV, greater than or equal to 0.5 eV, greater than 0.6 eV, between 0.4 eV and 0.6 eV, etc. Having the HOMO-HOMO energy gap between the host material and additive be sufficiently large prevents hole transport on the additive. Similarly, the energy gap 92 between the HOMO of the additive 76 and the LUMO of the dopant 80 may be sufficiently large (e.g., greater than 0.2 eV, greater than 0.3 eV, greater than 0.4 eV, greater than 0.5 eV, greater than or equal to 0.5 eV, greater than 0.6 eV, between 0.4 eV and 0.6 eV, etc.) to prevent doping of the additive.

In the example where the laterally conductive layer is an electron layer instead of a hole layers, similar design principles may apply to the LUMO instead of the HOMO. Specifically, the LUMO of the additive may be shallower than the LUMO of the host material and dopant such that there is no host-to-additive or dopant-to-additive transport. In both the hole based embodiment and the transport based embodiment, the additive may be described as having an energy gap relative to the host material (e.g., gap 90 in FIG. 7).

Any desired material may be used for the dopant 80 and the additive 76. Some possible p-type dopants that may be used include transition metal oxides such as molybdenum trioxides and tungsten trioxides. Another possible p-type dopant is 2,3,5,6-Tetrafluoro-7,7,8,8-tetracyanoquinodimethane (F4-TCNQ). Some possible n-type dopants that may be used include ytterbium (Yb), lithium (Li), or 8-Quinolinolato lithium (LiQ). Illustrative materials for additive 76 include 1,4-Bis(triphenylsilyl)benzene (UGH-2), 2,8-Bis (diphenyl-phosphoryl)-dibenzo[b,d]thiophene (PPT), 1,3-Bis(N-carbazolyl)benzene (mCP), Bathocuproine (BCP), 4,4'-Bis(N-carbazolyl)-1,1'-biphenyl (CBP), 3,3'-Di(9H-carbazol-9-yl)-1,1'-biphenyl (mCBP), 9-(4-tert-Butylphenyl)-3,6-bis(triphenylsilyl)-9H-carbazole (CzSi), Tris(2,4,6-trimethyl-3-(pyridin-3-yl)phenyl)borane (3TOYMB), 1,3-Bis(3, 5-dipyrid-3-ylphenyl)benzene (B3PyPB), Diphenyl[4-(triphenylsilyl)phenyl]phosphine oxide (TSPO1), Diphenyl-bis(4-(pyridin-3-yl)phenyl)silane (DPPS), 9,10-Bis[N,N-di-(p-tolyl)-amino]anthracene (TTPA), 4,4-bis(2,2-diphenylvinyl)-1,1-diphenyl (DPVB), 9-Phenyl-3,6-bis(9-phenyl-9Hcarbazol-3-yl)-9H-carbazole (Tris-PCz), N,N'-Bis[4-(diphenylamino)phenyl]-N,N'-di(1-naphthyl) benzidine, N,N'-Bis[4-(diphenylamino)phenyl]-N,N'-di-1-naphthalenyl-[1,1'-biphenyl]-4,4'-diamine (NPB-DPA).

It should additionally be understood that the specific example of FIG. 6A for how to form the laterally conductive layer having an additive is merely illustrative. In some examples, the additive and host materials may be mixed in a pre-mix. The pre-mix of host and additive may then be evaporated from a single source during the evaporative deposition (instead of from separate sources as in FIG. 6A). In general, any of the components of the laterally conductive layer may be pre-mixed for the evaporative deposition process if desired. Materials with similar boiling or sublimation points may be particularly suited to be pre-mixed.

Additionally, FIGS. 6A, 6B and 7 show an illustrative laterally conductive layer with a single additive for increasing resistance. This example is merely illustrative. In some cases, two or more additives may be included in the laterally conductive layer to increase resistance and correspondingly reduce lateral leakage.

The example of the laterally conductive layer with an additive being formed using evaporative deposition (as in FIG. 6A) is also merely illustrative. In general, any desired deposition techniques (e.g., solution based deposition such as inkjet deposition, spin coating, etc.) may be used to form the laterally conductive layer.

Figure 8A:
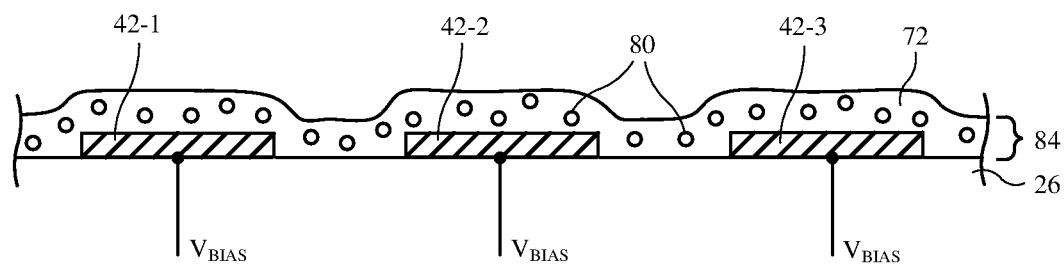
FIG. 8A is a cross-sectional side view of an illustrative system for biasing anodes to selectively increase resistance in a laterally conductive layer in accordance with an embodiment.

FIG. 8A is a cross-sectional side view of another system for forming a laterally conductive layer with increased resistance. In the technique shown in FIG. 8A, a differential bias may be applied to the anodes that deliberately causes leakage between the pixels. Laterally conductive layer 84 may be formed over anodes 42 on substrate 26. Laterally conductive layer 84 may include a dopant 80 interspersed within host material 72 similar to as discussed in connection with FIG. 6B. When the bias voltages ($V_{BIAS}$) are applied to the anodes to deliberately cause leakage, the resulting electric field may cause the dopant to undergo an irreversible change (e.g., an irreversible chemical reaction). The change to the dopants may cause the dopants to become inert. Take an example where laterally conductive layer 84 is a hole based layer. P-type dopant 80 may chemically react with the host, irreversibly losing the p-doping effect. When laterally conductive layer 84 is an electron based layer, the dopants may be n-type dopants that irreversibly lose the n-doping effect under the electric field caused by the bias voltages.

It should be noted that the bias voltage $V_{BIAS}$ provided to each anode need not be the same. The bias voltages applied to the anodes may be different for adjacent anodes. For example, a first bias voltage may be applied to anode 42-1 and a second bias voltage may be applied to anode 42-2. The first bias voltage and the second bias voltage may differ by more than 1 V, more than 2 V, more than 3 V, more than 5 V, more than 8 V, more than 10 V, etc. A pattern of different bias voltages may be simultaneously (or at least partially sequentially) applied to the anodes across the display.

This process of applying bias voltages to the anodes to stress the laterally conductive layer and cause degradation of the p-type dopants for increased resistance may occur over any desired length of time. In some cases, the biasing may occur for over one hour, over ten hours, over one hundred hours, over one thousand hours, etc.

The biasing may occur at any desired point in manufacturing of the display. In one embodiment, the bias voltages to degrade the p-type dopants may be applied immediately after formation (deposition) of laterally conductive layer 84. However, this example is merely illustrative. In another embodiment, one or more additional laterally conductive layers may be deposited over laterally conductive layer 84 before the process is performed. In some cases, the blanket cathode layer may be formed over the laterally conductive layer before the biasing process is performed. In these types of embodiments, it is desirable for the cathode layer to be electrically floating during the biasing process. This prevents a current path from the anodes to the cathode and instead encourages the desired leakage current between adjacent anodes.

Figure 8B:
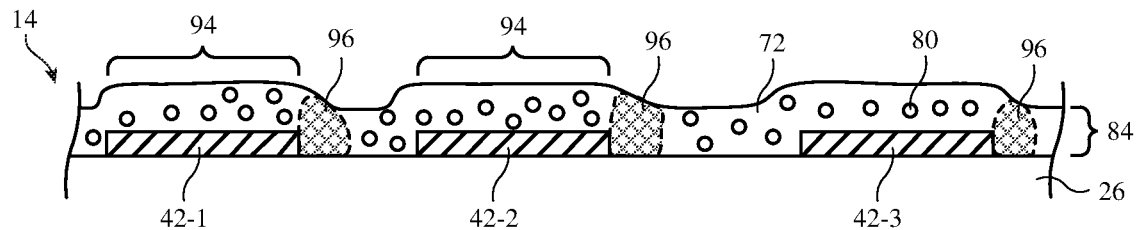
FIG. 8B is a cross-sectional side view of an illustrative display with a laterally conductive layer that includes high-resistance portions formed using the system of FIG. 8A in accordance with an embodiment.

FIG. 8B is a cross-sectional side view of a display with a laterally conductive layer that has undergone the biasing process of FIG. 8A. As shown in FIG. 8B, the laterally conductive layer 84 may include host material 72. In portions 94 that are formed above the anodes, the laterally conductive layer may be unchanged by the biasing process of FIG. 8A. In other words, the laterally conductive layer includes dopants 80 interspersed in an organic host material 72. However, some portions of the laterally conductive layer between the anodes (e.g., portions 96) have undergone irreversible dopant degradation as discussed in connection with FIG. 8A. Portions 96 therefore have an increased resistance that mitigates leakage current between the pixels in the display.

After the biasing process has been performed, the portions 96 may include host material 72 and an inert material (e.g., the degraded dopants). Since the dopant material has degraded and no longer serves as a dopant, the original dopant material may not be referred to as a dopant in portions 96 of the display after the biasing process. Instead, the laterally conductive layer may be described as having dopants 80 formed in portions 94 over the anodes. In contrast, the laterally conductive layer includes at least some portions (e.g., portions 96) between adjacent anodes that do not include the dopant 80. The at least some portions that do not include the dopant may include an inert material (e.g., the degraded dopant material) in addition to the organic host material. Because of the properties of the electric field that causes the dopant degradation, the high-resistance portions 96 may be adjacent to a respective anode (without vertically overlapping that anode).

Figure 9A:
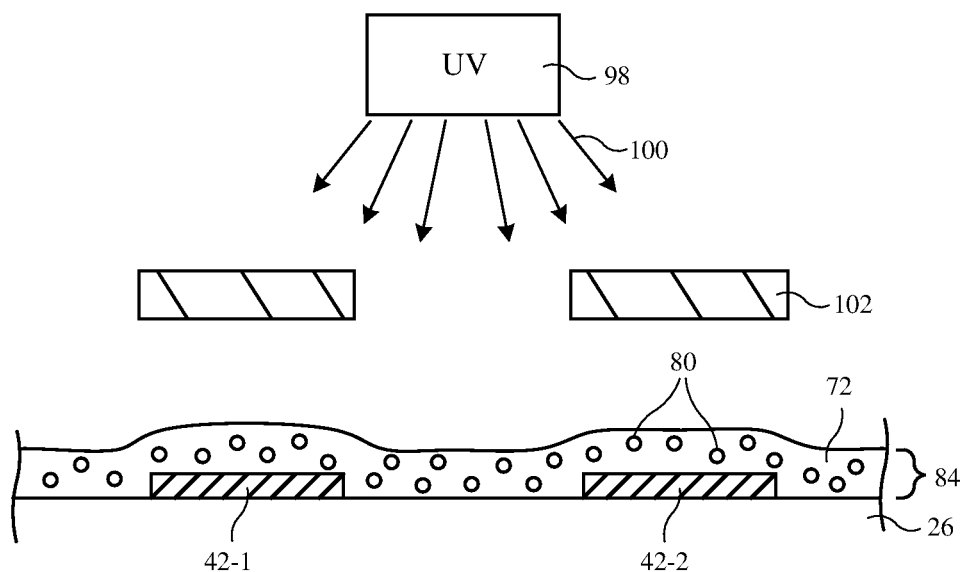
FIG. 9A is a cross-sectional side view of an illustrative system for using ultraviolet light exposure to selectively increase resistance in a laterally conductive layer in accordance with an embodiment.

FIG. 9A is a cross-sectional side view of a system for forming a laterally conductive layer with increased resistance. In the technique shown in FIG. 9A, an ultraviolet (UV) light source 98 may emit ultraviolet light 100 through a mask 102 onto laterally conductive layer 84. As shown in FIG. 9A, mask 102 (which may be opaque to the ultraviolet light 100) may cover anodes 42 of the display. Therefore, the ultraviolet light only reaches portions of the laterally conductive layer that are interposed between adjacent anodes.

The laterally conductive layer 84 may include a dopant 80 interspersed within host material 72 similar to as discussed in connection with FIG. 6B. Applying the ultraviolet light to the laterally conductive layer may cause the dopant to undergo an irreversible change (e.g., an irreversible chemical reaction), resulting in the dopant becoming inert. Take an example where laterally conductive layer 84 is a hole based layer. P-type dopant 80 may chemically react with the host under exposure to the ultraviolet light, irreversibly losing the p-doping effect. When laterally conductive layer 84 is an electron based layer, the dopants may be n-type dopants that irreversibly lose the n-doping effect when exposed to the ultraviolet light. This process of exposing the laterally conductive layer to ultraviolet light to cause degradation of the dopants for increased resistance may occur over any desired length of time.

The ultraviolet light exposure may occur at any desired point in manufacturing of the display. In one embodiment, the ultraviolet light exposure may occur immediately after formation (deposition) of laterally conductive layer 84. However, this example is merely illustrative. In another embodiment, one or more additional laterally conductive layers may be deposited over laterally conductive layer 84 before the ultraviolet exposure is performed.

Figure 9B:
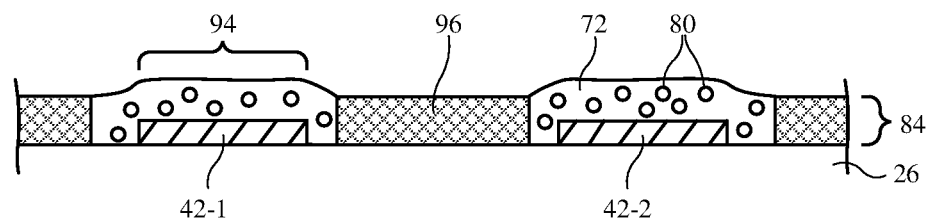
FIG. 9B is a cross-sectional side view of an illustrative display with a laterally conductive layer that includes high-resistance portions formed using the system of FIG. 9A in accordance with an embodiment.

FIG. 9B is a cross-sectional side view of a display with a laterally conductive layer that has undergone the UV light exposure of FIG. 9A. As shown in FIG. 9B, the laterally conductive layer 84 may include host material 72. In portions 94 that are formed above the anodes, the laterally conductive layer may be unchanged by the UV exposure process of FIG. 9A. In other words, the laterally conductive layer includes dopants 80 interspersed in an organic host material 72. However, some portions of the laterally conductive layer between the anodes (e.g., portions 96) have undergone irreversible dopant degradation as discussed in connection with FIG. 9A. Portions 96 therefore have an increased resistance that mitigates leakage current between the pixels in the display.

After the biasing process has been performed, the portions 96 may include host material 72 and an inert material (e.g., the degraded dopants). Since the dopant material has degraded and no longer serves as a dopant, the original dopant material may not be referred to as a dopant in portions 96 of the display after the UV exposure. Instead, the laterally conductive layer may be described as having dopants 80 formed in portions 94 over the anodes. In contrast, the laterally conductive layer includes at least some portions (e.g., portions 96) between adjacent anodes that do not include the dopant 80. The at least some portions that do not include the dopant may include an inert material (e.g., the degraded dopant material) in addition to the organic host material.

Figure 10A:
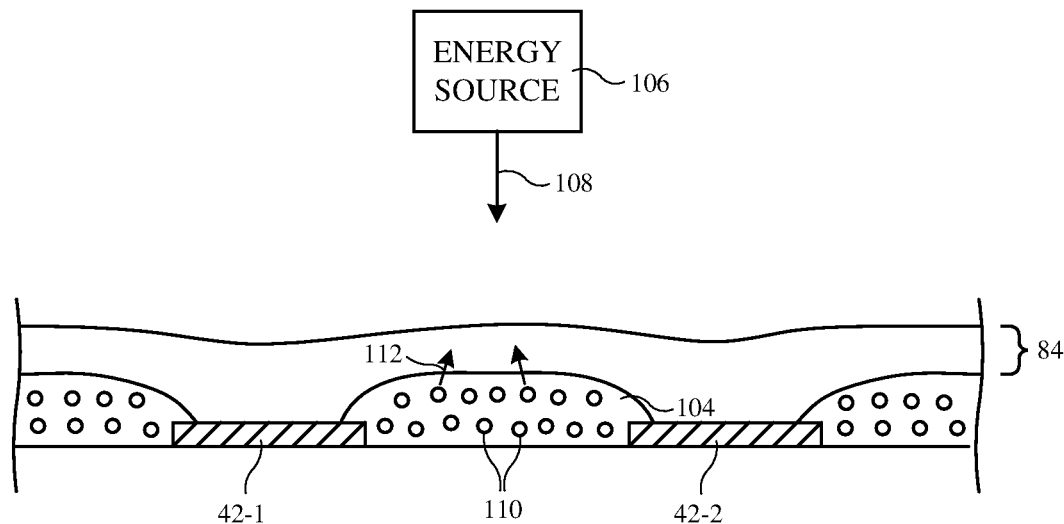
FIG. 10A is a cross-sectional side view of an illustrative system for exposing a pixel definition layer with additive to energy in accordance with an embodiment.

FIG. 10A is a cross-sectional side view of a system for forming a laterally conductive layer with increased resistance between anodes. The display of FIG. 10A has a pixel definition layer (PDL) 104 that is formed between the adjacent anodes. The pixel definition layer 104 may have openings over each anode to define the light-emitting area of each anode. Laterally conductive layer 84 may be formed over pixel definition layer 104. Laterally conductive layer 84 may include a host material and dopants, similar to as shown in the previous figures.

To increase the resistance of the laterally conductive layer between the pixels, the pixel definition layer 104 may include an additive 110. An energy source 106 may be used to apply energy 108 to the pixel definition layer 104 with additive 110. Energy 108 may be heat and/or ultraviolet light that causes additive 110 to diffuse (e.g., in directions 112) into the laterally conductive layer 84 near the interface between the PDL and the laterally conductive layer.

Figure 10B:
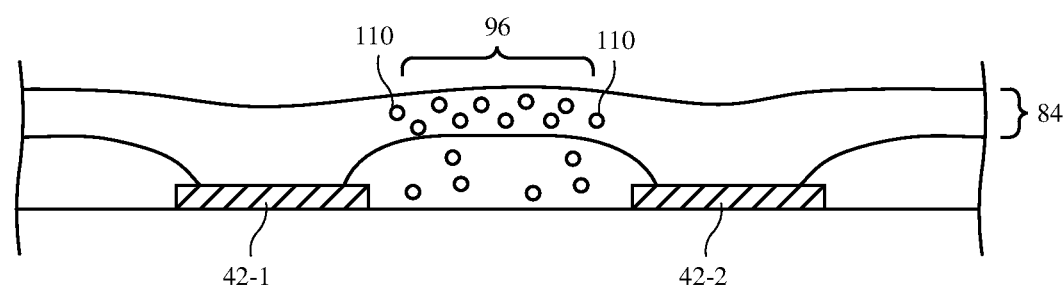
FIG. 10B is a cross-sectional side view of a display with a pixel definition layer and laterally conductive layer after the additive from FIG. 10A diffuses in accordance with an embodiment.

FIG. 10B is a cross-sectional side view of the display after the PDL additive is driven into the laterally conductive layer 84 by energy source 106. As shown, portion 96 of the laterally conductive layer may include the PDL additive. The PDL additive may be present in the host organic material of the laterally conductive material. A dopant may also be present in the host organic material of the laterally conductive material. Once the PDL additive is present in the laterally conductive layer, an irreversible chemical reaction may occur between the PDL additive, host material, and/or dopant. The chemical reaction may increase resistance of the laterally conductive layer 84 (e.g., by increasing the effective path length of charge through the laterally conductive layer, by reducing carrier mobility within the laterally conductive layer, by forming traps within the laterally conductive layer, etc.).

Figure 10C:
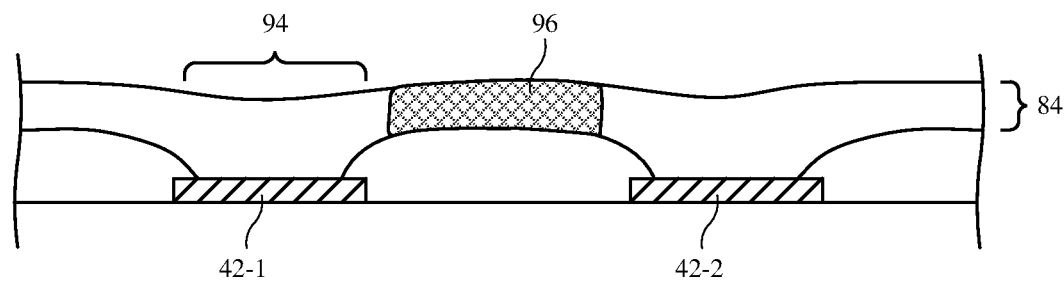
FIG. 10C is a cross-sectional side view of an illustrative display with a laterally conductive layer that includes high-resistance portions formed using the techniques of FIGS. 10A and 10B in accordance with an embodiment.

FIG. 10C is a cross-sectional side view of the display of FIG. 10B after the chemical reaction involving the PDL additive occurs. As shown in FIG. 10C, the laterally conductive layer 84 may include portions 94 that are formed above the anodes. In portions 94, the resistance may be unchanged and the laterally conductive layer may still include dopants interspersed in an organic host material. However, some portions of the laterally conductive layer between the anodes (e.g., portions 96) may have undergone an irreversible chemical reaction to increase resistance as discussed in connection with FIGS. 10A and 10B. Portions 96 therefore have an increased resistance that mitigates leakage current between the pixels in the display.

After the reaction has occurred, the portions 96 may include host material 72 and an inert material (e.g., the degraded dopants) or another resistance-reducing component (e.g., the PDL additive). The laterally conductive layer may be described as having first portions 94 with a first resistance and second portions 96 with a second resistance that is greater than the first resistance. The second portions 96 may include an additive in addition to the dopant (which may or may not be active) and the host material.

The PDL additive 110 that is used to reduce resistance in selective portions of the laterally conductive layer may be any desired type of material (e.g., phenyl azide, ortho-hydroxyphenyl azide, meta-hydroxyphenyl azide, tetrafluorophenyl azide, ortho-nitrophenyl azide, metal-nitrophenyl azide, diazirine, azideo-methylcuomarin, psoralen, etc.).

It should be noted that the above techniques for reducing lateral leakage between pixels may be used in any combination. In one specific example, UV light exposure (as in FIG. 9A) may be combined with the biasing of FIG. 8A to accelerate the rate at which the dopants degrade and the resistance is increased. Additional combinations may be used if desired.

Additionally, it should be noted that any of the aforementioned techniques for increasing resistance within a laterally conductive layer may be applied to any desired laterally conductive layer within a light-emitting diode (e.g., a hole injection layer, a hole transport layer, an emissive layer, an electron transport layer, an electronic injection layer, an electron blocking layer, a charge generation layer, and/or a hole blocking layer).

The foregoing is merely illustrative and various modifications can be made by those skilled in the art without departing from the scope and spirit of the described embodiments. The foregoing embodiments may be implemented individually or in any combination.

What is claimed is:

1. A display comprising:
    a substrate;
    an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate; and
    a laterally conductive layer formed over the substrate that has a first portion that forms part of the first organic light-emitting diode pixel and a second portion that forms part of the second organic light-emitting diode pixel, wherein the laterally conductive layer includes at least two different materials and wherein the at least two different materials include an organic host and a resistance-increasing additive.

2. The display defined in claim 1, wherein the resistance-increasing additive and the organic host have an energy gap that is greater than 0.2 eV.

3. The display defined in claim 1, wherein the resistance-increasing additive makes up more than 10% of the laterally conductive layer by volume.

4. The display defined in claim 1, wherein the first and second patterned electrodes comprise first and second anodes, wherein the laterally conductive layer is one of a plurality of organic light-emitting diode layers formed over the first and second anodes, and wherein the display further comprises a cathode that covers the plurality of organic light-emitting diode layers.

5. The display defined in claim 1, wherein the first and second patterned electrodes comprise first and second cathodes, wherein the laterally conductive layer is one of a plurality of organic light-emitting diode layers formed over the first and second cathodes, and wherein the display further comprises an anode that covers the plurality of organic light-emitting diode layers.

6. The display defined in claim 5, wherein the laterally conductive layer comprises an electron injection layer that is in direct contact with the first and second cathodes.

7. The display defined in claim 6, wherein the laterally conductive layer further comprises an n-type dopant and wherein a difference between a first lowest unoccupied molecular orbital of the resistance-increasing additive and a second lowest unoccupied molecular orbital of the organic host is greater than 0.2 eV.

8. The display defined in claim 1, wherein the laterally conductive layer comprises a layer selected from the group consisting of: a hole injection layer, a hole transport layer, an emissive layer, an electron transport layer, an electronic injection layer, an electron blocking layer, a charge generation layer, and a hole blocking layer.

9. The display defined in claim 1, wherein the laterally conductive layer has a thickness, wherein the first and second patterned electrodes are laterally separated by a distance, and wherein the distance is at least ten times greater than the thickness.

10. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate; and
a hole injection layer formed over the substrate that has a first portion that forms part of the first organic light-emitting diode pixel and a second portion that forms part of the second organic light-emitting diode pixel, wherein the hole injection layer includes at least two different materials and wherein the at least two different materials include an organic host and an additive.

11. The display defined in claim 10, wherein the laterally conductive layer further comprises a p-type dopant and wherein a difference between a first highest occupied molecular orbital of the resistance-increasing additive and a second highest occupied molecular orbital of the organic host is greater than 0.2 eV.

12. The display defined in claim 10, wherein the hole injection layer is in direct contact with the first and second patterned electrodes.

13. The display defined in claim 10, wherein the additive is a resistance-increasing additive.

14. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate; and
a laterally conductive layer formed over the substrate that has a first portion that forms part of the first organic light-emitting diode pixel and a second portion that forms part of the second organic light-emitting diode pixel, wherein the first and second portions overlap the first and second patterned electrodes and include an organic host material and dopants, wherein the laterally conductive layer includes a third portion formed between the first and second patterned electrodes that includes the organic host material and that does not include any dopants, and wherein the third portion has a higher resistance than the first and second portions.

15. The display defined in claim 14, wherein the third portion includes an inert material that is different than the organic host material.

16. The display defined in claim 14, wherein the third portion is positioned adjacent to the first patterned electrode without vertically overlapping the first patterned electrode.

17. The display defined in claim 14, wherein the laterally conductive layer is a hole injection layer and wherein the dopants comprise p-type dopants.

18. The display defined in claim 14, wherein the laterally conductive layer is an electron injection layer and wherein the dopants comprise n-type dopants.

* * * * *